(12) United States Patent
Nistler et al.

(10) Patent No.: US 7,235,974 B2
(45) Date of Patent: Jun. 26, 2007

(54) MAGNETIC RESONANCE SYSTEM WITH SUPPRESSION OF CAPACITIVE COUPLING BETWEEN AN RF SOURCE AND THE SUBJECT

(75) Inventors: Jürgen Nistler, Erlangen (DE); Markus Vester, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/389,476

(22) Filed: Mar. 24, 2006

(65) Prior Publication Data

US 2006/0279283 A1 Dec. 14, 2006

(30) Foreign Application Priority Data

Mar. 24, 2005  (DE)  ............... 10 2005 013 853

(51) Int. Cl.
*G01V 3/00* (2006.01)
(52) U.S. Cl. ........................ 324/318; 324/322
(58) Field of Classification Search ............ 324/318, 324/322, 319, 309, 307, 300; 600/410–445
See application file for complete search history.

(56) References Cited

U.S. PATENT DOCUMENTS

| | | | |
|---|---|---|---|
| 4,456,881 A * | 6/1984 | Compton | ............... 324/319 |
| 4,689,563 A * | 8/1987 | Bottomley et al. | ......... 324/309 |
| 5,111,147 A * | 5/1992 | Aubert | ................. 324/318 |
| 5,396,174 A | 3/1995 | Hanke et al. | |
| 6,020,740 A | 2/2000 | Renz et al. | |
| 6,998,842 B2 * | 2/2006 | Sinnema et al. | ............ 324/318 |
| 7,015,393 B2 * | 3/2006 | Weiner et al. | ................ 174/36 |

FOREIGN PATENT DOCUMENTS

| | | |
|---|---|---|
| DE | 103 53 341 A1 | 3/2005 |
| EP | 0 047 065 | 3/1982 |
| GB | 2 277 160 | 10/1994 |

* cited by examiner

*Primary Examiner*—Brij B. Shrivastav
(74) *Attorney, Agent, or Firm*—Schiff Hardin LLP

(57) ABSTRACT

An examination subject arranged in an examination volume of a magnetic resonance system can be excited to magnetic resonance by an RF transmission antenna. The RF transmission antenna is fashioned as a resonant structure that surrounds a central axis of the magnetic resonance system running within the examination volume. The resonance structure has inner edges proceeding around the central axis on its inner side facing the central axis, which inner edges form a capacitively-bridged annular gap extending parallel to the central axis. The RF transmission antenna is embedded into the gradient coil, such that the gradient coil at least radially outwardly and axially surrounds the RF transmission antenna), and the inner edges of the RF transmission antenna are connected in an electrically-conductive manner with inner sides of the gradient coil to the central axis. They are arranged radially inwardly (viewed from the annular gap) and axially completely cover the annular gap as well as axially at least partially cover the inner sides of the gradient coil.

9 Claims, 5 Drawing Sheets

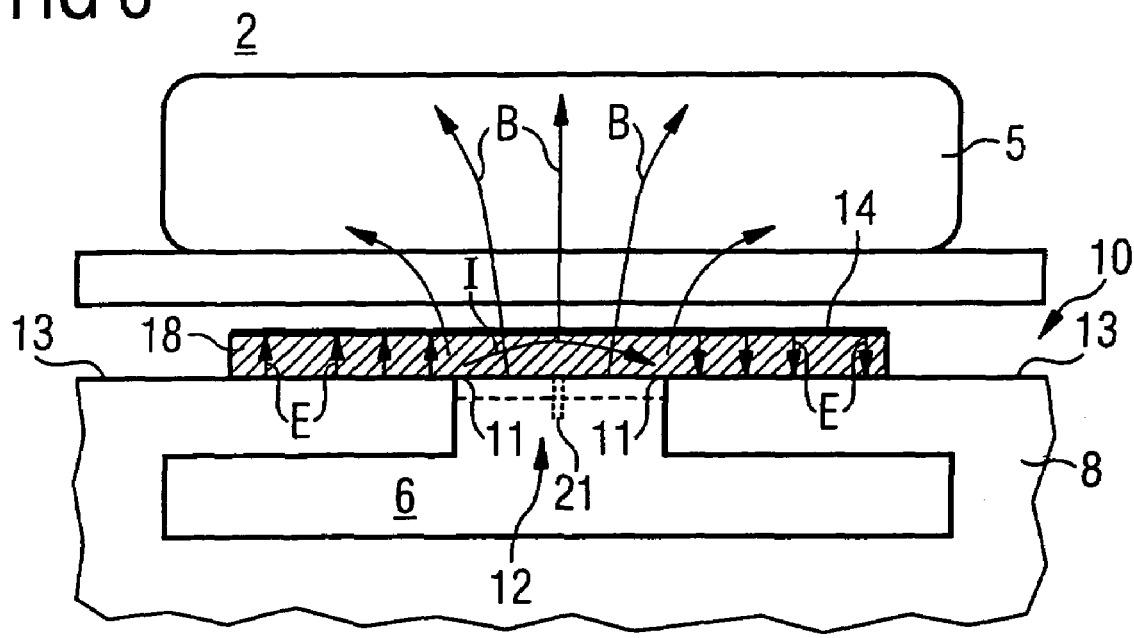
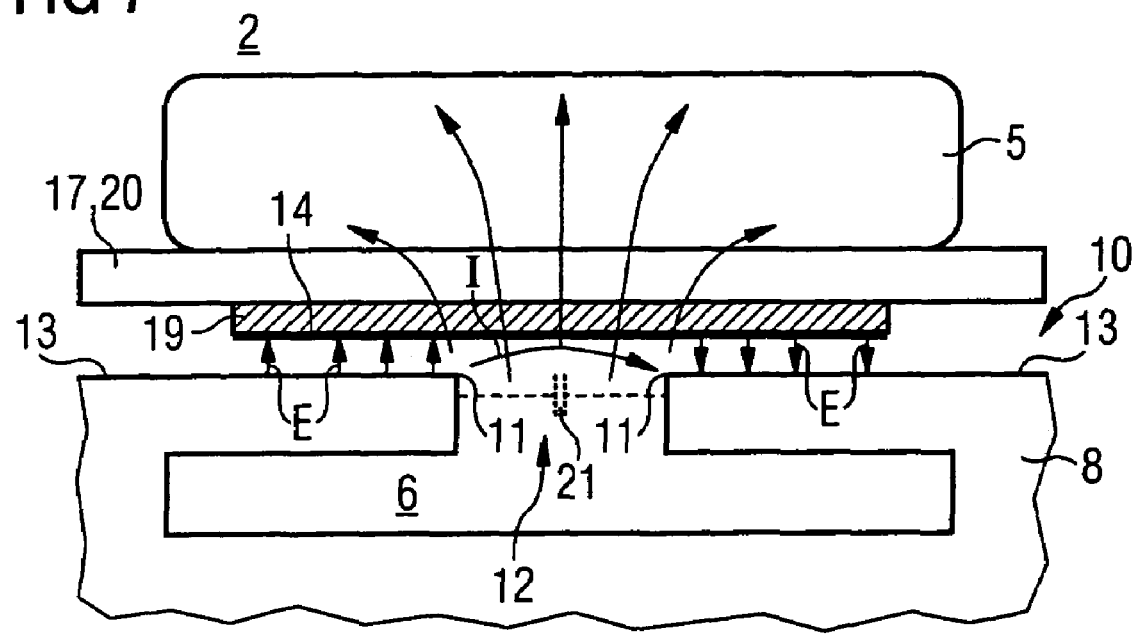

MAGNETIC RESONANCE SYSTEM WITH SUPPRESSION OF CAPACITIVE COUPLING BETWEEN AN RF SOURCE AND THE SUBJECT

BACKGROUND OF THE INVENTION

1. Field of the Invention

The present invention concerns a magnetic resonance system with a radio-frequency transmission antenna and a gradient coil, of the type wherein an examination subject arranged in an examination volume can be excited to magnetic resonance at an excitation frequency by means of the radio-frequency transmission antenna, and wherein the radio-frequency transmission antenna is essentially fashioned as a resonance structure that encloses surrounds a central axis of the magnetic resonance system running within the examination volume.

2. Description of the Prior Art

Magnetic resonance systems of the above type are generally known. For example, magnetic resonance systems in which the radio-frequency transmission antenna is fashioned as a birdcage resonator fall in this category, although magnetic resonance systems with birdcage resonators are not the subject matter of the present invention.

Radio-frequency transmission antennas of magnetic resonance systems should generate a magnetic excitation field in an examination subject (usually a person), causing magnetic resonance signal to be regenerated in the examination subject. After the excitation of these magnetic resonance signals it is possible to receive them by means of suitable radio-frequency reception antennas. The radio-frequency transmission antenna can be used for reception as well.

Eddy currents that lead to an unwanted heating of the examination subject are always associated with the generation of the magnetic excitation field. These eddy currents can not be prevented. Source-like currents whose electrical fields capacitively couple in the examination subject and lead to further heating of the examination subject are also generated in addition to the unavoidable eddy currents. Such capacitive couplings in particular occur at the conductors of the radio-frequency transmission antenna, but they can also occur (albeit to a lesser extent) at local receiver coils or at cables insofar as these are located in the effective range of the radio-frequency transmission antenna.

Furthermore, in the reception of magnetic resonance signals, loss resistances are coupled both inductively and capacitively. The inductive coupling is unavoidable, but the capacitive coupling should be prevented if possible.

The problem of capacitive coupling of the examination subject to the transmission antenna occurs in a particularly severe form in radio-frequency transmission antennas that are integrated into the gradient coil. In this type of magnetic resonance system

- the resonance structure has inner edges proceeding around the central axis on its inner side facing the central axis, these inner edges forming a capacitively-bridged annular gap extending parallel to the central axis, and
- the radio-frequency transmission antenna is embedded into the gradient coil, such that the gradient coil at least radially outwardly and axially surrounds the radio-frequency transmission antenna, and the inner edges of the radio-frequency transmission antenna are connected in an electrically-conductive manner with inner sides of the gradient coil facing the examination volume.

In this type of magnetic resonance system, the full transmission voltage (which can amount to several kilovolts) arises across the annular gap, which is usually part relatively narrow. Since the inner edges are connected in an electrically-conductive manner with the inner sides of the gradient coil and the inner sides are relatively large, a particularly large capacitance thus exists that leads to a large capacitive coupling. In addition, a relatively large local magnetic radio-frequency flux density also predominates immediately before the annular gap, such that particularly high local power loss densities, which can also lead to particularly significant heating, can occur by superimposition of eddy currents and capacitive currents in surface-proximate regions of the examination subject.

A direct and (without further measures) intrusive approach for minimization of the capacitive coupling is to select the distance of the radio-frequency transmission antenna from the examination subject optimally large, but this leads either to over-dimensioned radio-frequency transmission antennas or to a reduction of the spatial relationships (which are limited anyway) in the examination volume. An enlarged distance in the reception case also leads to a reduced reception sensitivity, even for local coils.

Theoretically it would be conceivable to divide the resonance capacitors (known as "multiple reduction"). In practice, however, this leads to increased capacitor losses and to an additional production expenditure. Moreover, this approach is not applicable when the radio-frequency transmission antenna is embedded into the gradient coil. The radio-frequency-sealed shielding surfaces that encase the gradient coil can not be interrupted.

It would also be possible to achieve a dissipation of the capacitive displacement currents via materials with high relative permittivity. For an appreciable effect, the thickness of such a material that must be introduced between the radio-frequency transmission antenna and the examination subject must be several centimeters, such that this solution likewise leads to over-dimensioned radio-frequency transmission antennas and a spatial constriction.

SUMMARY OF THE INVENTION

An object of the present invention is to suppress unwanted capacitive couplings of the radio-frequency source in the examination subject in a magnetic resonance system of the above-described type, and at the same time to avoid the disadvantages of the prior art.

The object is achieved in accordance with the invention by a magnetic resonance system of the above described type wherein a number of individual conductors are provided that proceed parallel to the central axis, the individual conductors being arranged radially inwardly (viewed from the annular gap outwardly) and that axially cover the annular gap completely and at least partially axially cover the inner sides of the gradient coil.

When the individual conductors are arranged central to the annular gap in the axial direction, the effect of the individual conductors is particularly high.

The individual conductors alternatively can be electrically isolated from one another or even be connected with one, another in an electrically-conductive manner via an annular connection element preceding around the central axis.

The individual conductors around the central axis preferably exhibit a tangential separation that is maximally as large as a radial minimum separation of the individual conductors from the examination subject. It is thereby achieved that capacitive residual components at the examination subject have already subsided (decayed).

The individual conductors can be arranged on a carrier structure that is in turn attached on the gradient coil. This approach has the advantage that tolerances can already have been taken into account in the compensation of the transmission antenna. A low-loss insulating material naturally must be used as such a carrier structure.

Alternatively, it is possible for the individual conductors to be arranged on a carrier tube that is fastened on a carrier element of the magnetic resonance system that is different from the gradient coil. This approach offers lower dielectric losses, but the carrier tube must be very rigid since a position shift of the individual conductors influences the resonance frequency of the radio-frequency transmission antenna.

The individual conductors capacitively bridge the annular gap. Given suitable dimensioning of the capacitive coupling between individual conductors and resonance structure, it is possible the annular gap to be exclusively capacitively bridged by the individual conductors. Separate resonance capacitors, as are required in the prior art, can therefore be omitted.

The radio-frequency transmission antenna preferably can be disconnected (rendered inoperable). In order to achieve this, detuning circuits by means of which such disconnection can be achieved are arranged in the individual conductors.

DESCRIPTION OF THE DRAWINGS

FIGS. 6 and 7 is modifications of the section from FIG. 4.

DESCRIPTION OF THE PREFERRED EMBODIMENTS

Figure 1:
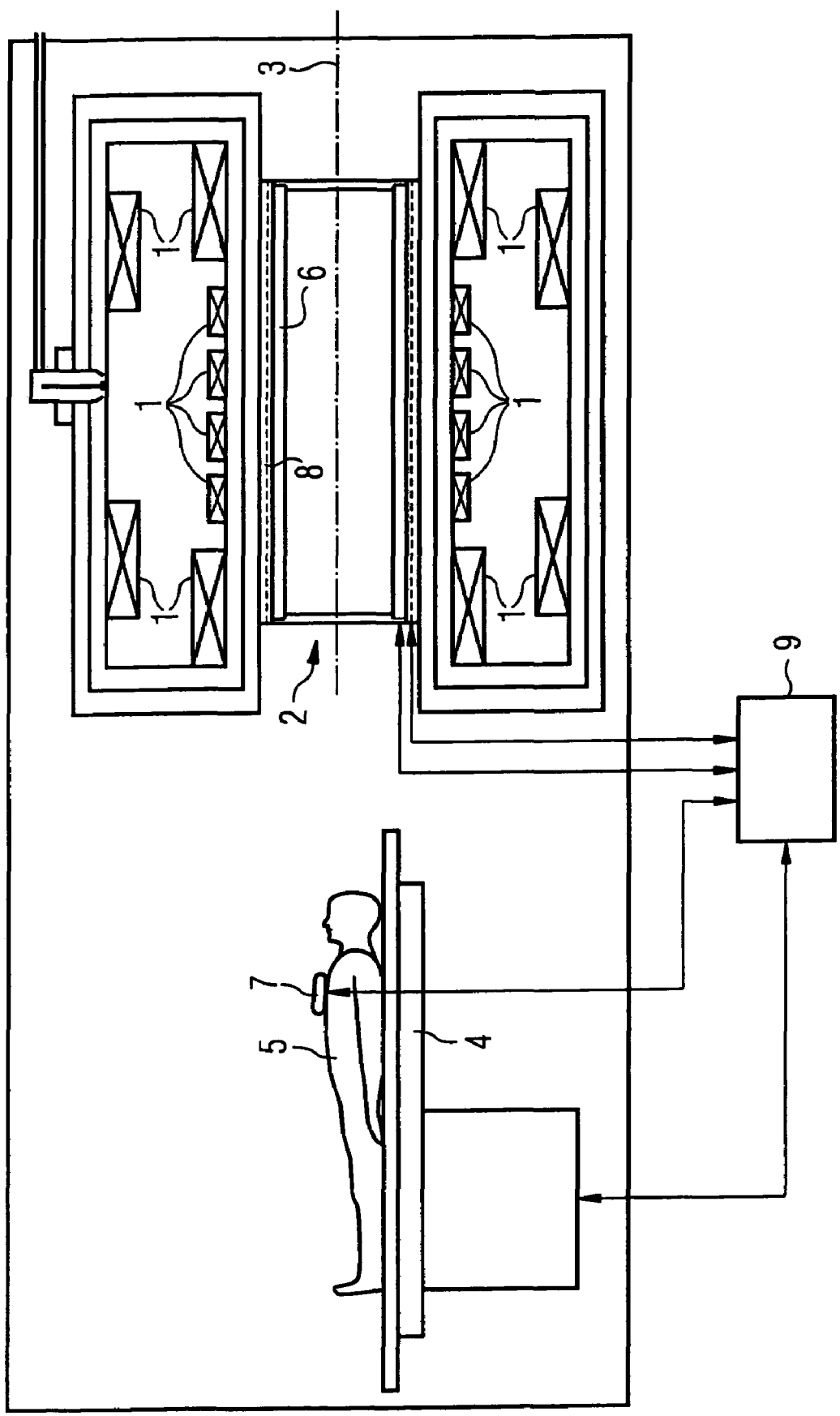
FIG. 1 schematically illustrates a magnetic resonance system.

As shown in FIG. 1, a magnetic resonance system comprises, among other things, a permanent magnetic system 1. The permanent magnet system 1 generates an essentially homogeneous magnetic field in an examination volume 2. The examination volume 2 is fashioned essentially as a cylinder, and defines a central axis 3 of the magnetic resonance system. The central axis 3 naturally runs within the examination volume 2. An examination subject 5 can be inserted into the examination volume 2 by means of a patient bed 4.

The magnetic resonance system also has (see also FIGS. 2 and 3) a radio-frequency transmission antenna 6. When it is located in the examination volume 2, the examination subject 5 can be excited to magnetic resonances by means of the radio-frequency transmission antenna 6. Excited magnetic resonances can then be received by means of the radio-frequency transmission antenna 6, which for this purpose can be switched over to reception, or by means of a local coil 7. For spatial coding of the magnetic resonances, the magnetic resonance system also normally has a number of gradient coils of which one is shown in FIGS. 1 through 3 and is provided with the reference character 8.

The activation of the radio-frequency transmission antenna 6, the local coil 7, the gradient coil 8 and the rest of the elements of the magnetic resonance examination system that are not shown in FIG as well as the evaluation of the magnetic resonances ensues via a known control and evaluation device 9. This is therefore connected with the radio-frequency transmission antenna 6, the local coil 7 and the gradient coil 8.

Figure 2:
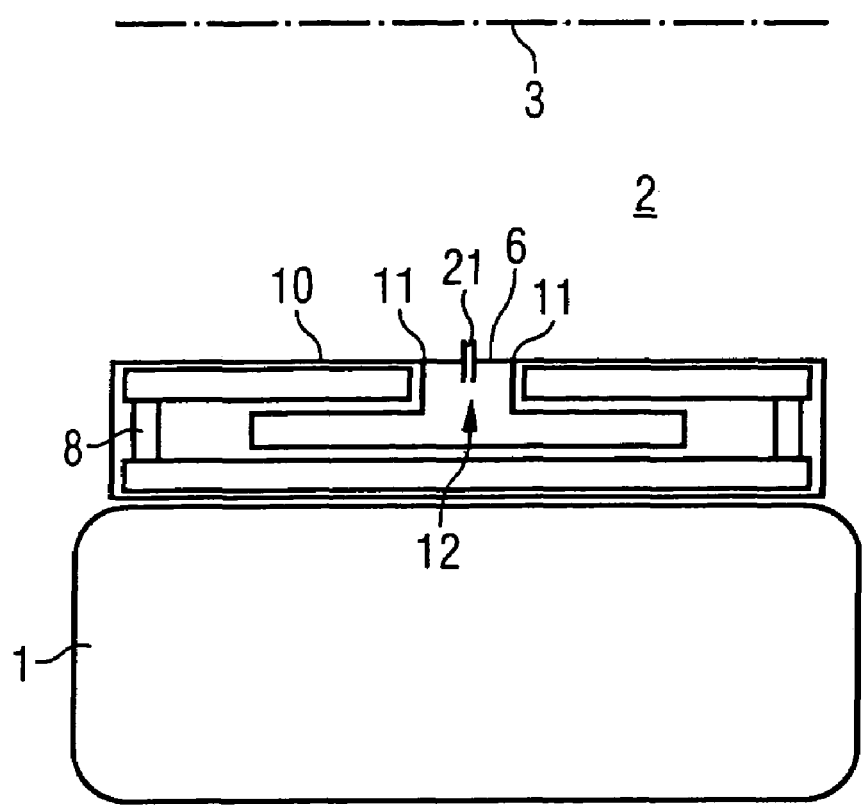
FIG. 2 is a section of the magnetic resonance system of FIG. 1.
Figure 3:
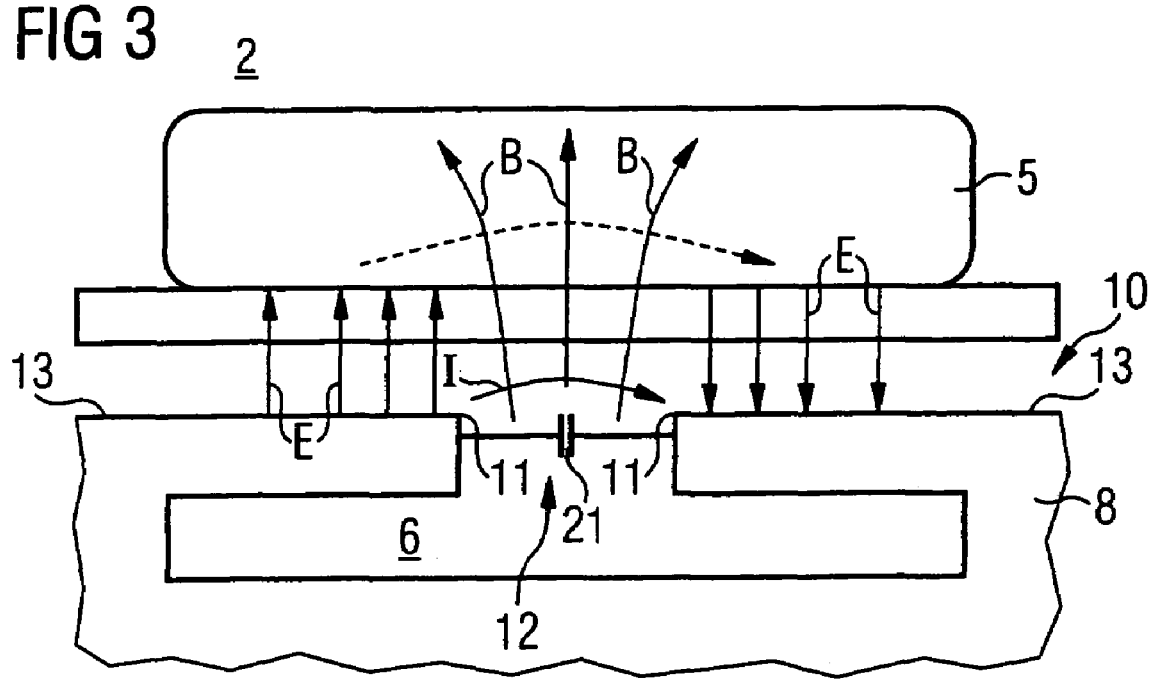
FIG. 3 shows field and current paths in the section from FIG. 2.

As is furthermore visible from FIGS. 1 through 3, the radio-frequency transmission antenna 6 is essentially fashioned as a resonance structure 6 that runs around the central axis 3.

According to FIGS. 2 and 3, the resonance structure 6 has inner edges 11 on its inner side 10 facing toward the central axis 3. The inner edges 11 run annularly around the central axis 3. They form an annular gap 12 that extends parallel to the central axis 3. This annular gap 12 is capacitively bridged or the inner edges 11 are capacitively coupled with one another (which is the same thing).

As show in FIGS. 2 and 3, the radio-frequency transmission antenna 6 is embedded in the gradient coil 8. The gradient coil 8 therefore surrounds the radio-frequency transmission antenna 6 radially outwardly and axially on both sides. The inner edges 11 of the radio-frequency transmission antenna 6 are connected in an electrically-conductive manner with inner sides 13 of the gradient coil 8, the inner side 13 of the gradient coil 8 faces toward the examination volume 2.

FIG. 3 shows the field and current paths of the radio-frequency transmission antenna 6 shown in FIG. 2. As can be seen from FIG. 3, the radio-frequency transmission antenna 6 generates a radio-frequency magnetic field B which is injected into the examination subject 5. This magnetic field B is the actual usable field that is used for excitation of magnetic resonances.

Eddy currents that are not shown as well in FIG. 3 are coupled with this magnetic field B. These eddy currents are unwanted but unavoidable.

Due to the electrically-conductive connection of the inner edges 11 of the radio-frequency transmission antenna 6 with the inner sides 13 of the gradient coil 8, however, a stronger displacement current I also flows that is capacitively coupled into examination subject 5 via an electrical field E. The suppression prevention of this capacitive coupling is the purpose of the present invention.

Figure 4:
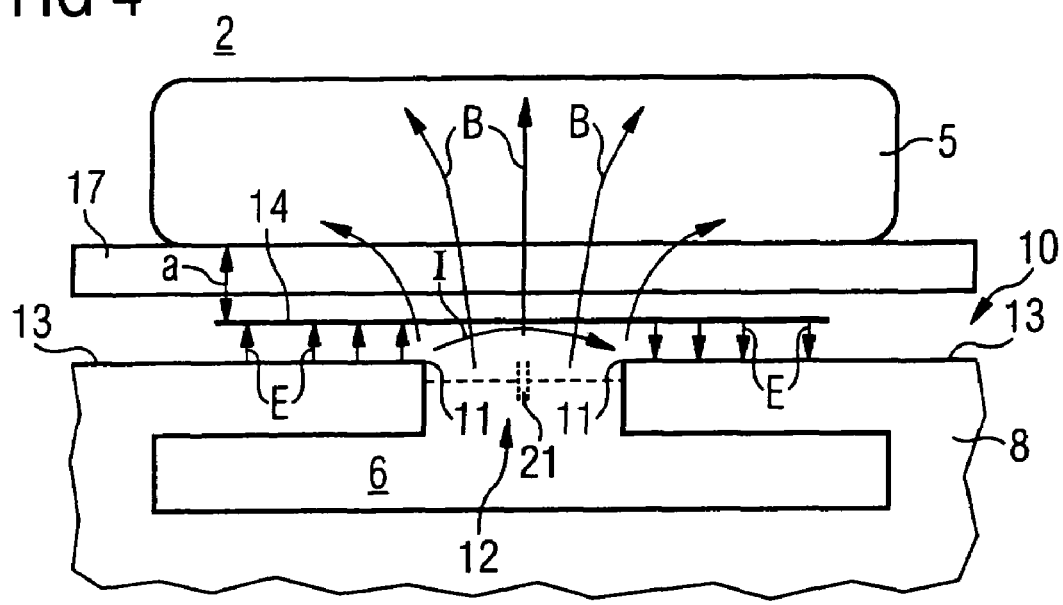
FIG. 4 shows an inventive modification in the section from FIG. 2.
Figure 5:
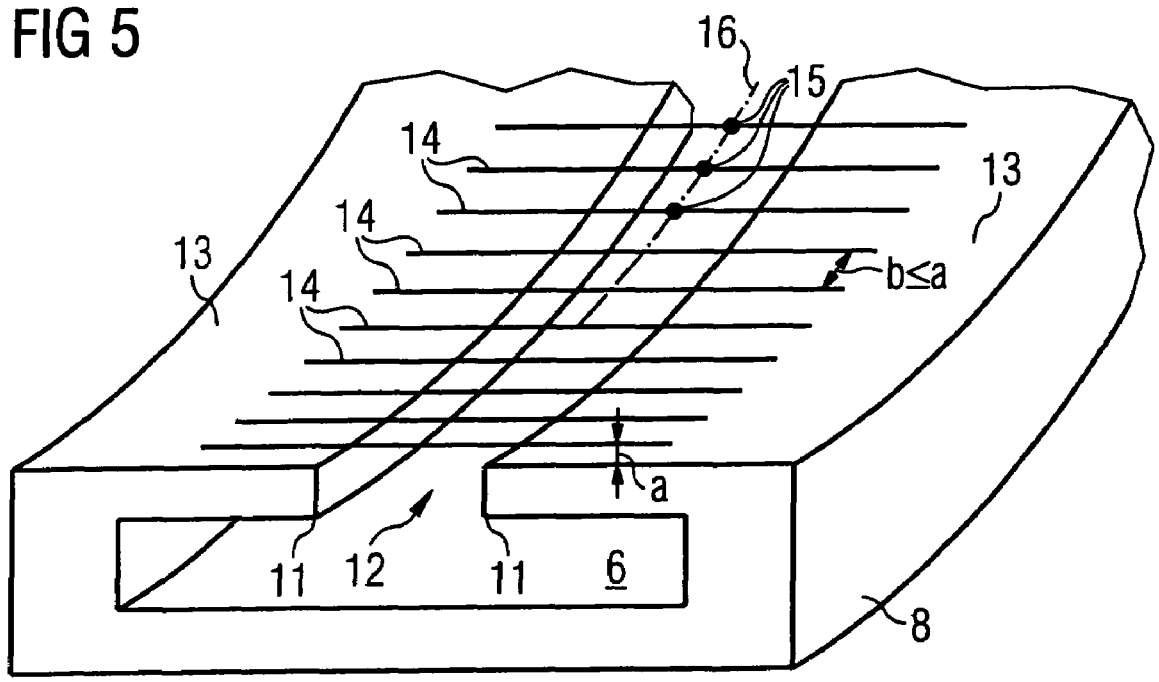
FIG. 5 is a perspective view of the section from FIG. 4.

As can be seen from FIGS. 4 and 5, a number of individual conductors 14 is provided for this purpose. The individual conductors 14 run parallel to the central axis 3. They are arranged radially inwards (viewed from the annular gap 12), thus closer to the central axis 3 than the annular gap 12. They cover the annular gap 12 completely in the axial direction (thus parallel to the central axis 3) as well as axially cover the inner sides 13 of the gradient coil 8 at least partially. In the axial direction, the individual conductors 14 are arranged coaxially with the annular gap 12.

The individual conductors 14 can be electrically insulated from one another. It is optionally also possible for the individual conductor centers 15 to be connected with one another in an electrically-conductive manner via a connection element 16 (indicated dashed in FIG. 5). In this case, the connection element 16 runs annularly around the central axis 3.

As can be seen from FIG. 4, the examination subject 5 is separated from the electrical components 6, 8, 14 by a separation layer 17. The separation layer 17 thus defines a radial minimum distance a that the individual conductors 14 exhibit at least from the examination subject 5. The individual conductors 14 (see FIG. 5) also thus exhibit a tangential separation b in the tangential direction, thus around the central axis 3. This tangential separation b, thus the distance b from individual conductor 14 to individual conductor 14, is advantageously maximally as large as the radial minimum distance a of the individual conductor 14 from the examination subject 5.

FIGS. 4 and 5 show the arrangement of the individual conductors 14, however not their attachment within the magnetic resonance system. This is now explained in detail in connection with FIGS. 6 and 7.

According to FIG. 6, the individual conductors 14 are arranged on a carrier structure 18. The carrier structure 18 is comprised of electrically insulating low-loss material, for example plastic. For its part, it is in turn attached on the gradient coil 8, advantageously on the inner sides 13 of the gradient coil 8. The fastening of the carrier structure 18 on the gradient coil 8 can ensue, for example, by adhesion, locking (catching; latching), plugging, screwing etc.

As an alternative to the embodiment from FIG. 6, the individual conductors 14 according to FIG. 7 can also be arranged on a carrier tube 19. The carrier tube 19 is fastened on a carrier element 20 that is distinct from the gradient coil 8. In particular, the separation layer 17 is considered as a carrier element 20, as is clear from FIG. 7.

In order to be able to act as a resonance structure, the inner edges 11 must (as already mentioned) be capacitively coupled; the annular gap 12 must thus be capacitively bridged. In the prior art, thus in the embodiment of the magnetic resonance system according to FIG. 2 and 3, this ensues via capacitors 21 which are connected on the inner edges 11. In contrast to this, in the inventively embodied magnetic resonance system of FIG. 4 and 5 a capacitive coupling of the inner edges 11 has already ensued via the individual conductors 14. Given suitable dimensioning of this coupling, the annular gap 12 is exclusively capacitively bridged by the individual conductors 14. The capacitors 21 of the prior art are therefore no longer necessary. They can thus be omitted. This is indicated in FIG. 4 through 7, in that the capacitors 21 are shown only dashed in FIG. 4, 6 and 7 and not at all in FIG. 5.

Figure 8:
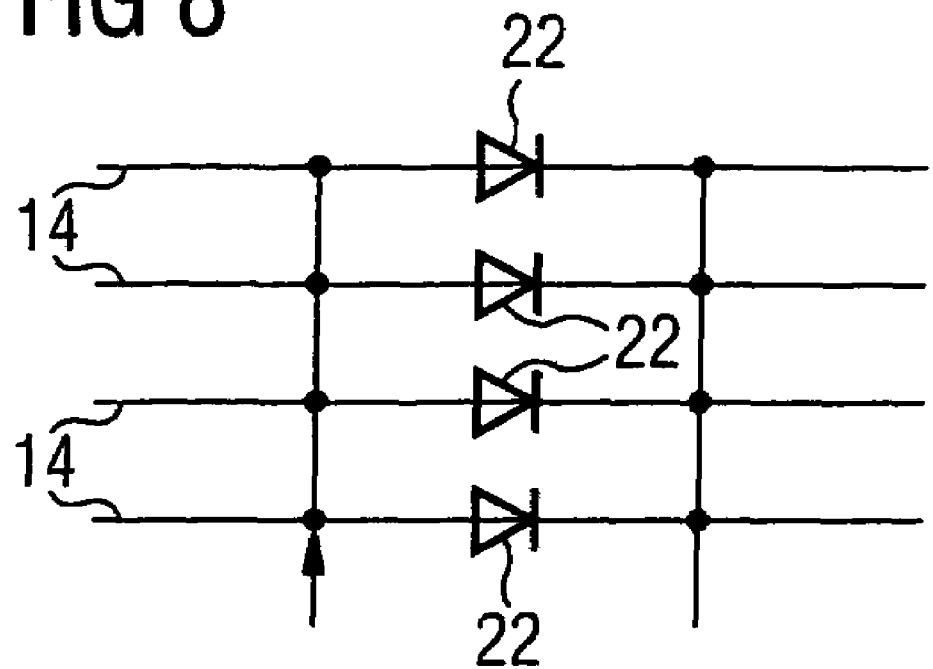
FIGS. 8 and 9 schematically shows a number of individual conductors nested with one another.
Figure 9:
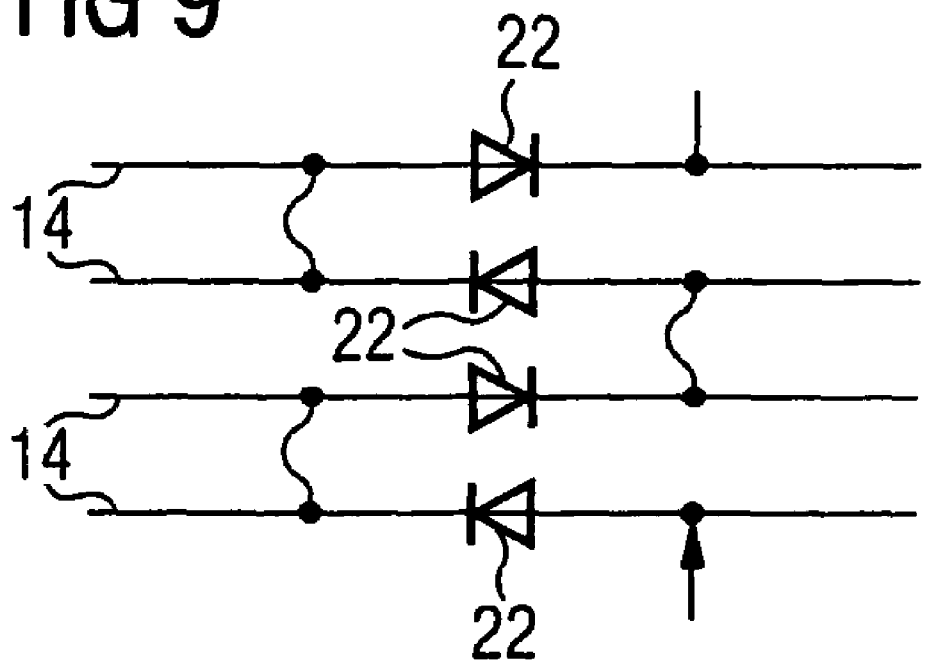

In the prior art, detuning circuits by means of which the radio-frequency transmission antenna 6 can be detuned are associated with the capacitors 21. Such detuning circuits 22 are likewise present in the present invention. However, they are arranged in the individual conductors 14 (see FIG. 8 and 9). Furthermore, as is generally typical, they are, for example, fashioned as PIN diodes 22.

For simplification, the detuning circuits 22 are activated in groups (possibly even all together, always equally). The detuning circuits 22 are therefore alternatively connected in parallel to one another (see FIG. 8) or connected in series with one another (see FIG. 9).

An effective shielding of the examination subject 5 from capacitive coupling of the displacement current I of the radio-frequency transmission antenna 6 can thus be achieved in a simple manner by means of the inventively embodied magnetic resonance system.

Although modifications and changes may be suggested by those skilled in the art, it is the intention of the inventors to embody within the patent warranted hereon all changes and modifications as reasonably and properly come within the scope of their contribution to the art.

The invention claimed is:

1. A magnetic resonance system comprising:
   a magnetic resonance scanner having an examination volume adapted to receive an examination subject therein, said examination volume having a longitudinal extent with a central axis proceeding through said longitudinal extent of said examination volume;
   a radio frequency transmission antenna disposed at relative to said examination volume to emit radio frequency energy into the examination volume, said radio frequency transmission antenna having a resonant structure having an inner side facing said central axis, said inner side comprising inner edges proceeding around said central axis, said inner edges forming a capacitively-bridged annular gap disposed parallel to said central axis;
   a gradient coil in which said radio frequency transmission antenna is embedded, said gradient coil outwardly and radially surrounding said radio frequency transmission antenna, and said gradient coil having inner sides facing said examination volume, said inner edges of said radio frequency transmission antenna being electrically connected to said inner sides of said gradient coil; and
   a plurality of individual conductors disposed parallel to said central axis and being disposed radially inwardly relative to said annular gap, said individual conductors extending axially so that each completely across said angular gap and at least partially extends over and is spaced from the inner sides of the gradient coil.

2. A magnetic resonance system as claimed in claim 1 wherein said individual conductors are disposed coaxially with said annular gap in an axial direction relative to said central axis.

3. A magnetic resonance system as claimed in claim 1 wherein said individual conductors are electrically isolated from each other.

4. A magnetic resonant system as claimed in claim 1 wherein each individual conductor has a conductor center, and comprising an annular connection element surrounding said central axis and electrically connecting said individual conductors at said conductor centers.

5. A magnetic resonant system as claimed in claim 1 wherein said individual conductors around said central axis exhibit a tangential separation from each other that is maximally as large as a radial minimum distance of an individual conductor from the examination subject.

6. A magnetic resonance system as claimed in claim 1 comprising a carrier structure at which said individual conductors are mounted, said carrier structure being attached to said gradient coil.

7. A magnetic resonance system as claimed in claim 1 comprising a carrier tube at which said individual conductors are mounted, and a carrier element, separate from said gradient coil, connecting said carrier tube to said magnetic resonant scanner.

8. A magnetic resonance system as claimed in claim 1 wherein said annular gap is covered only by said individual conductors.

9. A magnetic resonance system as claimed in claim 1 comprising a detuning circuit to detune said radio frequency transmission antenna.

\* \* \* \* \*